(12) United States Patent
Castor-Perry

(10) Patent No.: US 8,947,142 B2
(45) Date of Patent: Feb. 3, 2015

(54) COMMON MODE TRIMMING WITH VARIABLE DUTY CYCLE

(71) Applicant: Cypress Semiconductor Corporation, San Jose, CA (US)

(72) Inventor: Kendall V. Castor-Perry, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/801,492

(22) Filed: Mar. 13, 2013

(65) Prior Publication Data

US 2013/0307601 A1 Nov. 21, 2013

Related U.S. Application Data

(60) Provisional application No. 61/647,636, filed on May 16, 2012.

(51) Int. Cl.
*H03K 3/017* (2006.01)
*H03K 5/08* (2006.01)

(52) U.S. Cl.
CPC .................................. *H03K 5/084* (2013.01)
USPC ........................................ 327/175; 327/172

(58) Field of Classification Search
None
See application file for complete search history.

(56) References Cited

U.S. PATENT DOCUMENTS

| 3,997,892 | A | * | 12/1976 | Susset ........................... 341/136 |
|---|---|---|---|---|
| 5,359,294 | A | | 10/1994 | Ganger et al. |
| 5,424,678 | A | * | 6/1995 | Heyl et al. ....................... 330/51 |
| 5,440,305 | A | * | 8/1995 | Signore et al. ................. 341/120 |
| 5,592,128 | A | * | 1/1997 | Hwang ............................ 331/61 |
| 5,739,720 | A | | 4/1998 | Lee et al. |
| 6,028,546 | A | | 2/2000 | Signell et al. |
| 6,630,898 | B1 | | 10/2003 | Stegers et al. |
| 6,674,387 | B1 | * | 1/2004 | Ott ................................. 341/155 |
| 6,970,126 | B1 | | 11/2005 | O'Dowd et al. |
| 7,157,956 | B2 | | 1/2007 | Wei et al. |
| 7,486,217 | B2 | | 2/2009 | Matsushita et al. |
| 7,944,385 | B2 | | 5/2011 | Le Guillou et al. |
| 7,952,506 | B2 | * | 5/2011 | Kumamoto et al. ........... 341/143 |
| 2001/0003159 | A1 | | 6/2001 | Dooley et al. |
| 2009/0212867 | A1 | | 8/2009 | Fukuzawa et al. |

OTHER PUBLICATIONS

Measurement Computing. "Fundamental Signal Conditioning". 20 pages.
Search Report for U.S. Appl. No. 13/801,492, dated Jan. 2013, 11 pages.
International Search Report for International Application No. PCT/US13/38663 dated Aug. 23, 2013; 2 pages.
Written Opinion of the International Searching Authority for International Application No. PCT/US13/38663 dated Aug. 23, 2013; 2 pages.

\* cited by examiner

*Primary Examiner* — Cassandra Cox

(74) *Attorney, Agent, or Firm* — Lowenstein Sandler LLP

(57) ABSTRACT

A resistive divider circuit may be operatively coupled with a modulated resistor circuit, wherein the resistive divider circuit and the modulated resistor circuit for an effective resistor circuit providing an effective attenuation. A variable duty cycle signal modulates the modulated resistor circuit to control the effective attenuation.

21 Claims, 7 Drawing Sheets

COMMON MODE TRIMMING WITH VARIABLE DUTY CYCLE

RELATED APPLICATIONS

This application claims the benefit of U.S. Provisional Patent Application No. 61/647,636, filed on May 16, 2012, which is hereby incorporated by reference.

TECHNICAL FIELD

This disclosure relates to the field of electric circuits and, in particular, to resistive trimming.

BACKGROUND

Users often employ various signal attenuation and conditioning methods in electric circuit design. Accurately measuring small values of differential voltages superimposed on much larger, varying common mode voltages requires a high value of common mode rejection ratio (CMRR) in the data acquisition system. When the input voltages exceed the system's analog power supply voltage, these voltages need to be attenuated by external resistors before being applied to differential processing inputs, such as an instrumentation amplifier or a differential-input analog-to-digital converter (ADC).

Designers may either purchase costly pre-trimmed instrumentation amplifier ICs or include their own trimming arrangements. Some form of adjustable resistor is used to deliberately unbalance the resistive input attenuator and trim the common mode rejection (CMR). Such resistors may be adjusted through physical means (i.e. a mechanical wiper moved with a screwdriver), or may be implemented as electronically programmable or electronically tunable component arrays.

In order to achieve the required CMRR, users often employ trimmable, high precision resistors. Such resistors are expensive and need to be calibrated. Furthermore, using, adjusting, and calibrating such resistors to achieve common mode performance is often unsuitable for an application because of cost, size, power, or other grounds.

Physically adjustable components require a manual calibration step on the production line. Electronically adjustable component arrays can facilitate an automated process but their value resolution, i.e. step size, is often marginal for the task. Continuously tunable resistances such as FETs and light-dependent resistors are generally not stable enough for use in many applications. All these approaches consume considerable additional circuit board space, which is sub-optimal when compact system design is required. Additionally, the costs associated with the aforementioned solutions are high.

BRIEF DESCRIPTION OF THE DRAWINGS

The present disclosure will be understood more fully from the detailed description given below and from the accompanying drawings of various embodiments of the present disclosure, which, however, should not be taken to limit the present disclosure to the specific embodiments, but are for explanation and understanding only.

DETAILED DESCRIPTION

Figure 1:
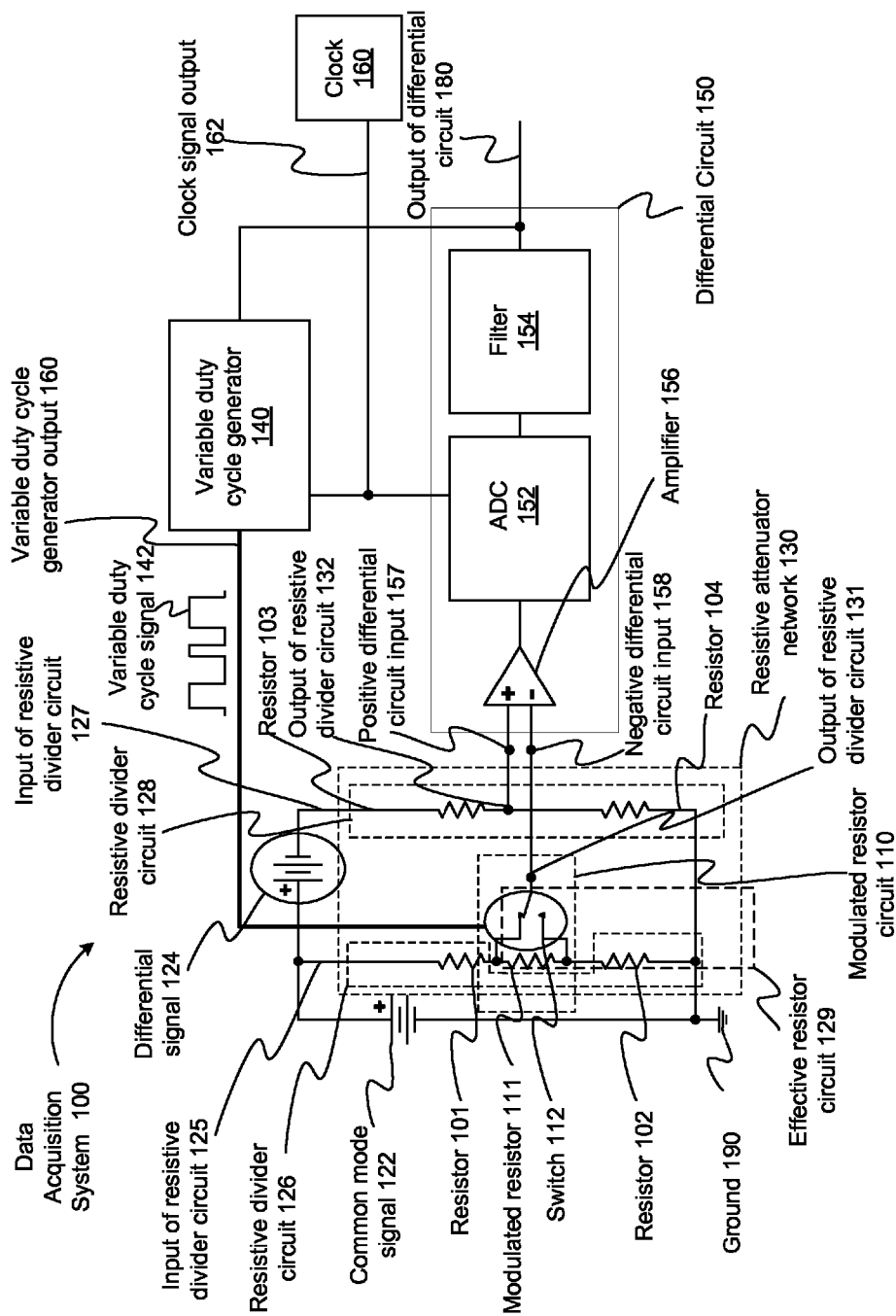
FIG. 1 is a block diagram illustrating one embodiment of a data acquisition system having a resistive attenuator network.

In the following description, for purposes of explanation, numerous specific details are set forth in order to provide a thorough understanding of the present disclosure. It will be evident, however, to one skilled in the art that the present disclosure may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the disclosure. The phrase "in one embodiment" located in various places in this description does not necessarily refer to the same embodiment.

Embodiments of a method and apparatus of the present disclosure describe the attenuation and conditioning of electrical signals. Common mode voltage levels may approach or exceed the power supply level and need to be attenuated and conditioned to reach an acceptable common mode rejection ratio. Furthermore, accurately measuring small values of differential voltage superimposed on a much larger, varying common mode voltage requires a high value of common mode rejection ratio (CMRR) in the data acquisition system. When the input voltage exceeds the system's analog power supply voltage, these voltages need to be attenuated by external resistors before being applied to differential processing inputs, such as an instrumentation amplifier or a differential-input analog-to-digital converter.

In one embodiment, the automated adjustment of common mode rejection in a resistive attenuator network by a variable duty cycle is described. The use of a variable duty cycle to adjust common mode rejection in resistive attenuator may achieve high common mode rejection even though the resistive attenuator network is constructed from resistors whose inherent accuracy may not be sufficient to guarantee the rejection required.

The use of a variable duty cycle achieves control, with unlimited resolution, of the common mode rejection of any differential input system that uses an input attenuator. The use of a variable duty cycle to adjust common mode rejection in resistive attenuator requires only a few additional passive components added to the differential input attenuator, plus switches that can be part of the data acquisition integrated circuit (IC). With appropriate selection of the system timing, a resistive attenuator using variable duty cycle to adjust common mode rejection can be used with at least sampling converters and delta-sigma converter circuits. The intrinsic filtering response of a delta-sigma converter circuit permits a particularly economical implementation. All calibration waveforms may be synthesized internal to the processing IC, meaning that multiple attenuators can be calibrated without the need for external variable components. The CMRR can be trimmed on the production line or dynamically on a test signal. The calibration may be made dependent on temperature, supply voltage, or any other system variable.

FIG. 1 is a block diagram illustrating one embodiment of a data acquisition system having a resistive attenuator network. In this embodiment, data acquisition system 100 includes resistive attenuator network 130, a differential circuit 150, and a variable duty cycle generator 140. The resistive attenuator network 130 may be used to attenuate common voltages that approximate or exceed the operating voltage of differential circuit 150. Resistor 101 and resistor 102 form a first resistive divider circuit 126, and resistor 103 and resistor 104 form a second resistive divider circuit 128. Each resistive divider circuit 126 and 128 is operatively coupled to an input of the differential circuit 150. In FIG. 1, the second resistive divider circuit 128 is connected to the positive differential circuit input 157, and the first resistive divider circuit 126 is coupled with the negative differential circuit input 158. Additionally, modulated resistor circuit 110 is operatively coupled to the first resistive divider circuit 126. Modulated resistor circuit 110 comprises modulated resistor 111, which is coupled between resistor 101 and resistor 102, and switch 112. Switch 112 connects the negative differential circuit input to two points: the upper and the lower terminals of modulated resistor 111. In the present embodiment, the switch 112 switches from a higher resistance to a lower resistance. Switch 112 is modulated by a variable duty cycle signal 142 generated by a variable duty cycle generator 140.

In the embodiment illustrated in FIG. 1, differential circuit 150 is composed of amplifier 156, an analog-to-digital converter (ADC) 152, a filter 154, a positive and negative differential circuit input 157 and 158, respectively, and an output of the differential circuit 180. Amplifier 156 receives a differential input signal at the positive differential circuit input 157 and negative differential circuit input 158 and amplifies the differential input signal. The amplifier 156 may be an instrumentation amplifier, or other device. The ADC 152 receives the amplified signal and converts the analog signal to a digital signal. The ADC 152 may be a delta-sigma converter circuit, successive approximation register (SAR) ADC, or other device. Filter 154 filters the output of the ADC 152 and can remove any sidebands caused by the modulation of modulated resistor circuit 110 coupled in the inputs of the differential circuit 150. Filter 154 may be separate from or is part of ADC 152, but for ease of discussion, filter 154 is shown as a discrete circuit block. It should be noted that differential circuit 150 may include all, some, none, or multiples of the circuit blocks: amplifier 156, ADC 152, and filter 154. It also should be noted that some circuit blocks, amplifier 156, ADC 152, and filter 154, may inherently be part of another circuit block (e.g., the a delta-sigma ADC will inherently contain filter 154) Additionally, the circuit blocks, amplifier 156, ADC 152, and filter 154, may be arranged in any order.

For ease of discussion, resistive divider circuit 126 operatively coupled to modulated resistor circuit 110 has been described to be coupled to the negative differential circuit input 158 while resistive divider circuit 128 is coupled to positive differential circuit input 157. It should be noted that resistive divider circuit 126 operatively coupled to modulated resistor circuit 110 could be coupled to the positive differential circuit input 157 while resistive divider circuit 128 is coupled to the negative differential circuit input 158.

In one embodiment, a voltage (e.g., common mode signal 122) is received at the input of resistive divider circuit 125, wherein the voltage (e.g., common mode signal 122) received at the input of resistive divider circuit 125 is attenuated to an operational voltage of the differential circuit 150. For example, a high-voltage may be received at the inputs (e.g., 125 and 127) of a resistive attenuator network 130 that is too high a voltage (e.g., common mode signal 122) to be effectively received by differential circuit 150. The differential circuit 150 may have an operational voltage of 3V while the voltage (e.g., common mode signal 122) at the input of resistive divider circuit 125 is 50V. 50V received directly at the input of the differential circuit 150 (e.g., negative differential circuit input 158) would likely damage the differential circuit 150. Consequently, the resistive divider circuit 126 attenuates the voltage (e.g., common mode signal 122) to a voltage below 3V—to an operational voltage of the differential circuit 150. It should be noted that the values used here are for exemplary purposes only.

In one embodiment, the attenuation of the resistive divider circuit 126 can be modulated using an on-chip switch, for example, switch 112, fed a variable duty cycle signal 142 from a variable duty cycle generator 140. The duty cycle of the variable duty cycle signal 142 is varied. The variable duty cycle signal 142 modulates the modulated resistor circuit 110 which varies the attenuation of the resistive divider circuit 126 and can be used to trim the resistive attenuator network 130. It should be noted that trim stability depends only on the inherent stability of the resistors being switched, and on the duty cycle stability of the variable duty cycle generator 140.

In one embodiment, modulated resistor circuit 110 is modulated with a variable duty cycle signal 142 generated by variable duty cycle generator 140 such as a PWM, delta-sigma modulator, or other similar approach. However, it should be noted that in alternative embodiments, modulated resistor circuit 110 is modulated with a with a variable frequency signal. The modulated resistor circuit 110, which when operatively coupled to resistive divider circuit 126 can control the effective attenuation of the effective resistor circuit 129. In the present embodiment, the effective resistor circuit 129 is the modulated resistor circuit 110 coupled in series with resistor 102. Switch 112 toggles between the upper terminal and lower terminal of modulated resistor 111. Switch 112 changes the attenuation as seen at the output of resistive divider circuit 131 by switching between a lower attenuation (i.e., switch 112 connected to the upper terminal of modulated resistor 111) and a higher attenuation (i.e., switch 112 connected to the lower terminal of modulated resistor 111). The effective attenuation is attenuation at the output of resistive divider circuit 131. Accordingly, the resistive divider circuit 126 can attenuate a common mode signal 122 and the attenuation may be controlled to unlimited precision by the variable duty cycle signal 142 provided by a delta-sigma modulator or similar approach.

In one embodiment, the resistive attenuator network 130, which comprises resistive divider circuit 126 and resistive divider circuit 128 and a modulated resistor circuit 110, may be coupled to the positive differential circuit input 157 and negative differential circuit input 158 of a differential circuit 150, respectively. The common mode rejection of the resistive attenuator network 130 can be adjusted by modulating the modulated resistor circuit 110 to control an effective attenuation of the resistive divider circuit 126. With such a resistive attenuator network 130, the common mode rejection ratio of data acquisition system 100 may be increased.

In one embodiment, the periodic switching of the modulated resistor circuit 110 modulates the gain of that leg of the resistive attenuator network 130 with the switching function of the variable duty cycle signal 142. As variable duty cycle signal 142 changes, the average gain mismatch created by the switching sequence also changes. In such a manner, at some duty cycle, the initial residual mismatch in the resistive attenuator network 130, and perhaps in the subsequent differential stages of differential circuit 150, is compensated. Consequently, the sensitivity to a common mode signal 122 is effectively cancelled out. It should be noted that differential circuit 150 may be configured to contain numerous stages, for example multiple stages of ADC 152.

In the embodiment illustrated in FIG. 1, switch 112, also known as a changeover switch, effectively switches the negative differential circuit input 158 between a higher attenuation and lower attenuation. The modulated resistor circuit 110 is modulated by the variable duty cycle signal 142, which allows switch 112 to alternately connect the negative differential circuit input 158 to two different nodes of the resistive attenuator network 130—one at the upper node and one at the lower node of modulated resistor 111. The effective attenuation is the attenuation as seen at the output of resistive divider circuit 131 and controlled by the switching action of switch 112. Switch 112 switches from a lower attenuation (upper terminal of modulated resistor 111 to ground 190) to a higher attenuation (lower terminal of modulated resistor 111 to ground 190)

For example, if the common mode signal 122 is 10V, resistor 101 is 9 Ohms, resistor 102 is 8 Ohms, the modulated resistor 111 is 2 Ohms, and the duty cycle is 50%, the effective attenuation of the common mode signal 122 is 50% or 5V. Likewise, the attenuation of the common mode signal 122 changes in relation to the effective attenuation and can be adjusted by modulating the modulated resistor circuit 110. It should be noted that the component values are provided only as an example and that the components may have other values in alternative embodiments It should be noted that the configuration of switch 112 is not the only configuration possible, as will be evident from additional embodiments discussed below. In one embodiment, the switch 112 conducts negligible current but is exposed to the full signal voltage. Consequently, the resistance of the switch, or switches, connecting the nodes is immaterial because it does not affect the gain equation. Therefore, even if the resistance of the switch 112 changes with supply voltage or temperature, the mean value of the duty-cycled attenuation factor will not change. Additionally, no currents are changing as a result of the switching, and therefore sidebands coupled to the negative differential circuit input 158 are negligible. Moreover, the impedance at the switch nodes is typically much lower than alternative switch configurations, so there is no need to periodically charge the parasitic capacitance of the a single switch. Since the resistance value and linearity of the changeover switch configuration does not factor in the gain function, the changeover switch may be designed using field-effect transistors. For example, regular MOS transmission gate architecture or similar architectures can be used.

Variable duty cycle generator 140 may be implemented in various ways. In one embodiment, for example, variable duty cycle generator 140 may be implemented using a single-bit delta-sigma modulator circuit. A variable duty cycle signal 142 derived from a delta sigma modulator effectively affords infinite resolution of variable duty cycle signal 142. In another embodiment, a pulse-width modulator (PWM) circuit may be used as variable duty cycle generator 140 that generates variable duty cycle signal 142. Although the use of only a PWM circuit is perfectly valid, some applications may require additional signal precision that precludes the use of a PWM circuit. However, in another embodiment, a PWM generator, driven by a multi-bit delta-sigma modulator, can also be used to generate variable duty cycle signal 142. Such a configuration may provide greater precision than using only a PWM circuit to generate the variable duty cycle signal 142. It should be noted that a variable frequency signal might also be used to modulate the value of trimming resistors. However, using a variable frequency signal may be impractical in data acquisition systems whose timings are already set by a fixed frequency system clock.

In another embodiment, both branches of the resistive attenuation network 130 (e.g., resistive divider circuit 126 and 128) may be configured so that both branches have a modulated resistor circuit, like modulated resistor circuit 110. Such a configuration would enable a more refined balancing of the small effects generated by the parasitic capacitances of the switches. Some general considerations of implementing a dual switch approach will be discussed below and apply here.

In one embodiment, a data acquisition system 100 may, for example, be a programmable system-on-chip device, instrumentation IC, analog-to-digital converter (ADC), and other devices.

Figure 2:
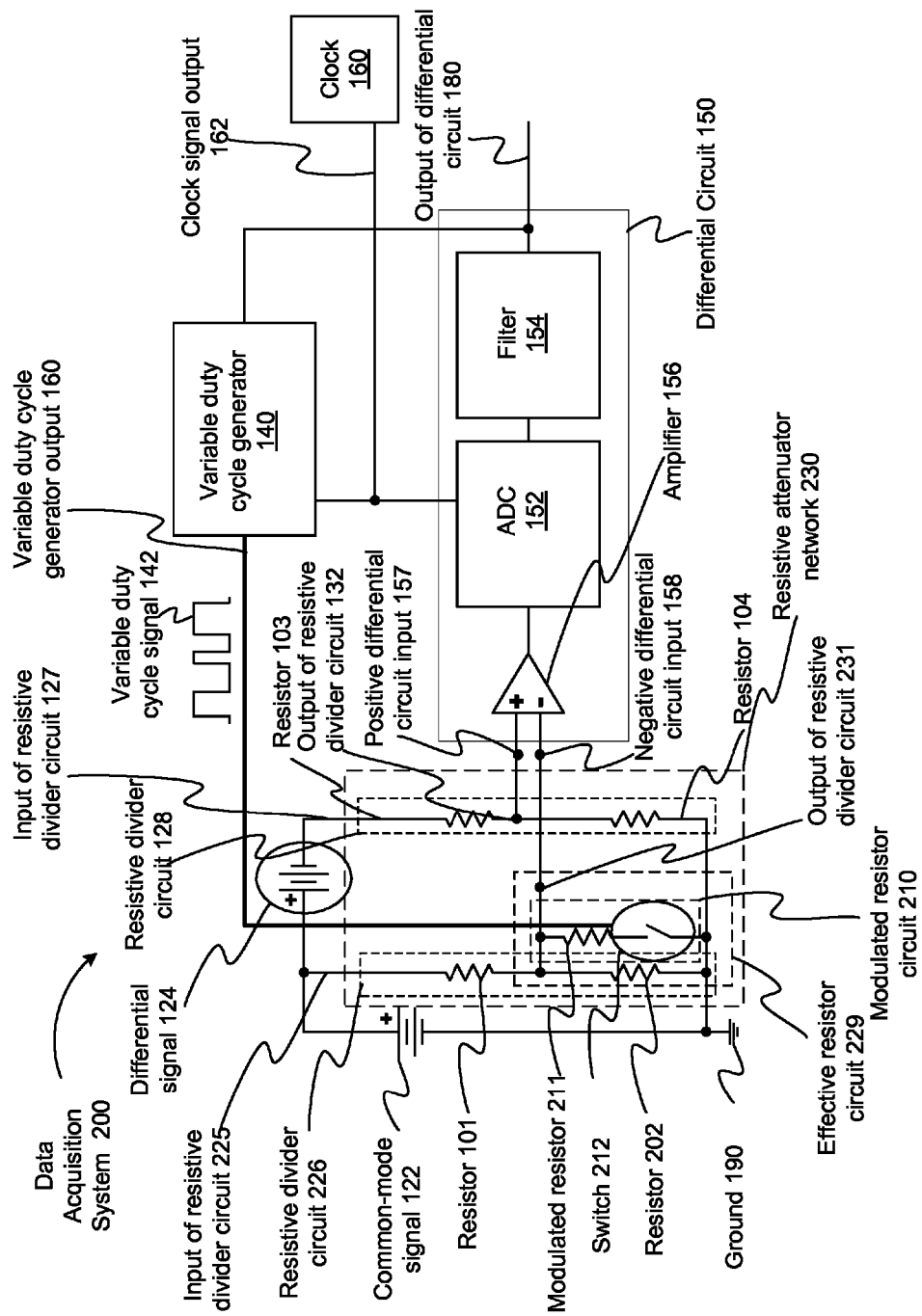
FIG. 2 is a block diagram illustrating a data acquisition system having a resistive attenuator network in accordance with another embodiment.

FIG. 2 is a block diagram illustrating a data acquisition system having a resistive attenuator network in accordance with another embodiment. In one embodiment, data acquisition system 200 includes the resistive attenuator network 230, the differential circuit 150, and variable duty cycle generator 140. In one exemplary embodiment, the resistive attenuator network 230 may be used to attenuate common mode voltages that approximate or exceed the operating voltage of differential circuit 150. Resistor 101 and resistor 202 form a first resistive divider circuit 226 while resistor 103 and resistor 104 form a second resistive divider circuit 128. Each resistive divider circuit 226 and 128 is operatively coupled to a negative and positive differential circuit input 158 and 157, respectively. The second resistive divider circuit 128 is connected to the positive differential circuit input 157 while the first resistive divider circuit 226 is coupled the negative differential circuit input 158. Additionally, modulated resistor circuit 210 is operatively coupled to the first resistive divider circuit 226. Modulated resistor circuit 210 comprises modulated resistor 211 in series with switch 212. Modulated resistor circuit 210 is coupled in parallel with resistor 202. Switch 212 connects the modulated resistor 211 to ground 190. Switch 212 is modulated by variable duty cycle signal 142 generated by variable duty cycle generator 140. In one embodiment, field-effect transistors can be used to implement switch 212. For example, n-channel MOS switches to ground 190 can be used.

In the embodiment illustrated in FIG. 2, switch 212 modulates the modulated resistor circuit 210, so that modulated resistor 211 toggles between an open circuit and ground 190. As a result, the apparent resistance of the modulated resistor circuit 210 is the modulated resistor value divided by Ton/Tperiod (i.e., assuming that the on switch resistance is negligible). For example, if the modulated resistor 211 is switched in for 10% of the total duration, the modulated resistor 211 apparent value is ten times the modulated resistor 211 physical value. Likewise, the equivalent resistance of the effective resistor circuit 229 can be modulated. As a result the effective attenuation at the output of resistive divider circuit 231 can be changed based on variable duty cycle signal 142. For example, if resistor 202 is 100 Ohms, the modulated resistor 211 is 10 Ohms, and the switch 212 is on 10% of the time (10% duty cycle), the apparent resistance of modulated resistor 211 is 100 Ohms and the equivalent resistance of effective resistor circuit 229 is 50 Ohms. If resistor 101 is 50 Ohms and common mode signal is 10V, the effective attenuation is 50% or 5V. Accordingly, the attenuation of common mode signal 122 changes in relation to the effective attenuation of the effective resistor circuit 229 and can be adjusted by modulating the modulated resistor circuit 210. It should be noted that the component values are provided only as an example and that the components may have other values in alternative embodiments.

Switch 212, unlike switch 112, conducts current as a result of the switching. The switching activity sidebands that couple onto the output of the resistive divider circuit 231. That is, modulation will cause sidebands to appear on the negative differential circuit input 158. Consequently, the type of variable duty cycle generator 140 used depends, in part, on the nature of the subsequent filtering and analog-to-digital conversion that processes the output of the resistive attenuator network 230. In one embodiment, the choice of a delta-sigma modulator to create the switching sequences ensures that the modulation components are strongly concentrated around the mean clock frequency of clock 160, with very little low frequency content apart from the desired static trim value, which can be of essentially unlimited resolution. Consequently, a low pass filter can effectively remove the frequency components. In one embodiment, filter 154, configured as a low pass filter, may be implemented in the analog domain before conversion, or in the digital domain. In one embodiment, using a delta-sigma converter circuit (i.e., ADC) is particularly economical because the delta-sigma ADC's own decimation filter can be used to suppress the parasitic components caused by modulation. In this embodiment, the order of the decimation filter should be one higher than the higher of the ADC modulator order and the trim sequence modulator order.

In one embodiment, if ADC 152 is a sampling converter, such as a successive approximation register (SAR) ADC, used to convert the output of the resistive attenuator network (e.g. 130, 230, 330, 430, 530), then additional filtering is needed either before or after the conversion. Using analog filtering before such a converter is good practice for the prevention of aliasing. In this case, the transfer function of the input filter is adjusted, if necessary, so that filter provides effective suppression of the modulation terms on the input signal. Digital post-filtering may also be carried out.

Figure 3:
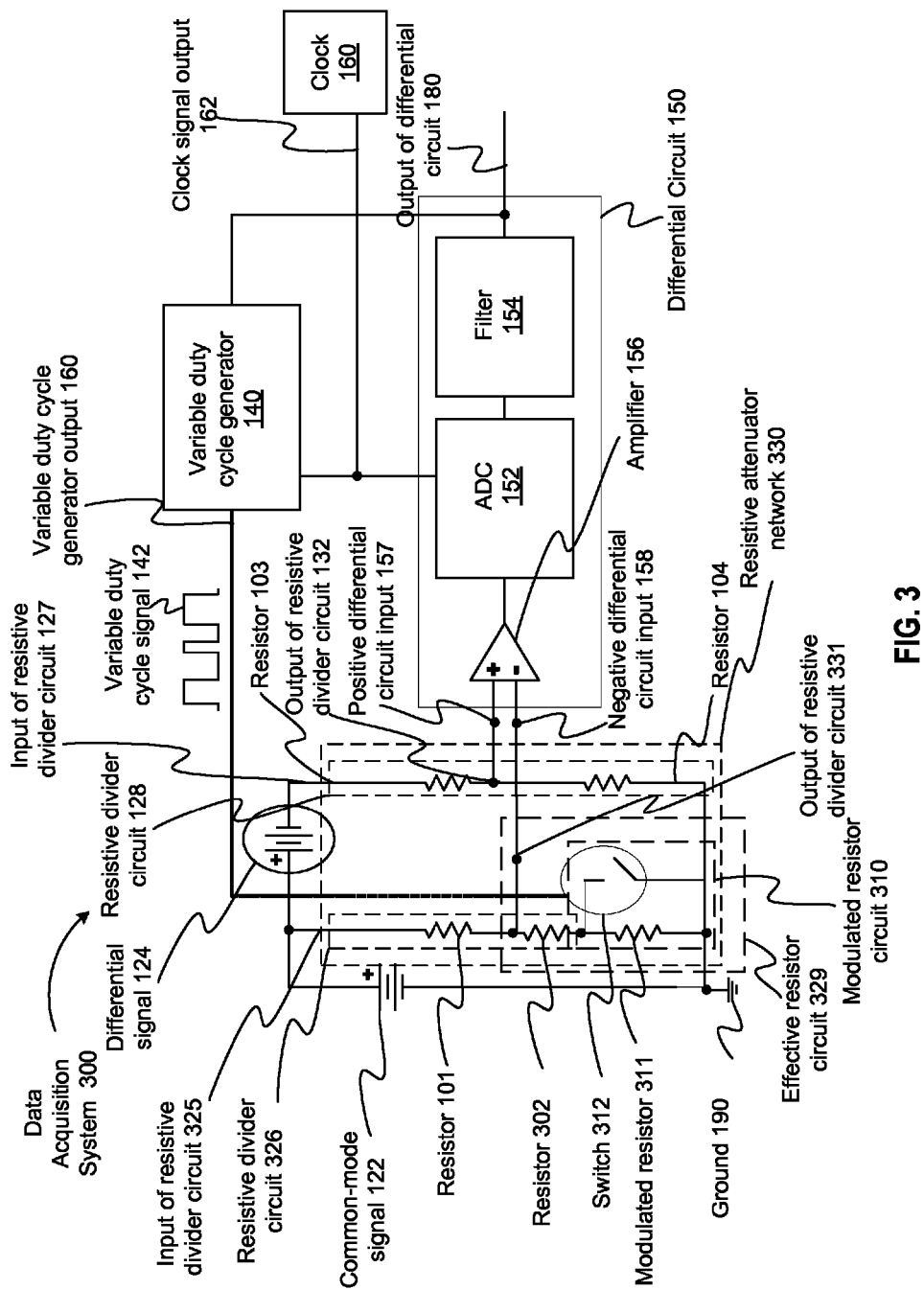
FIG. 3 is a block diagram illustrating a data acquisition system having a resistive attenuator network in accordance with another embodiment.

FIG. 3 is a block diagram illustrating a data acquisition system having a resistive attenuator network in accordance with another embodiment. The data acquisition system 300 in FIG. 3 may perform the same or similar actions, functions, operations, and methods as well as be configured in the same or similar manner as the data acquisition system 200 of FIG. 2. Additionally, the data acquisition system 300 may include the additional or alternative features as follows.

In FIG. 3 the modulated resistor circuit 310 comprises modulated resistor 311 and switch 312. Modulated resistor 311 is coupled in series with resistor 302. Switch 312 is situated at the node, connecting resistor 302 and modulated resistor 311 and connects the node to ground 190.

Figure 4:
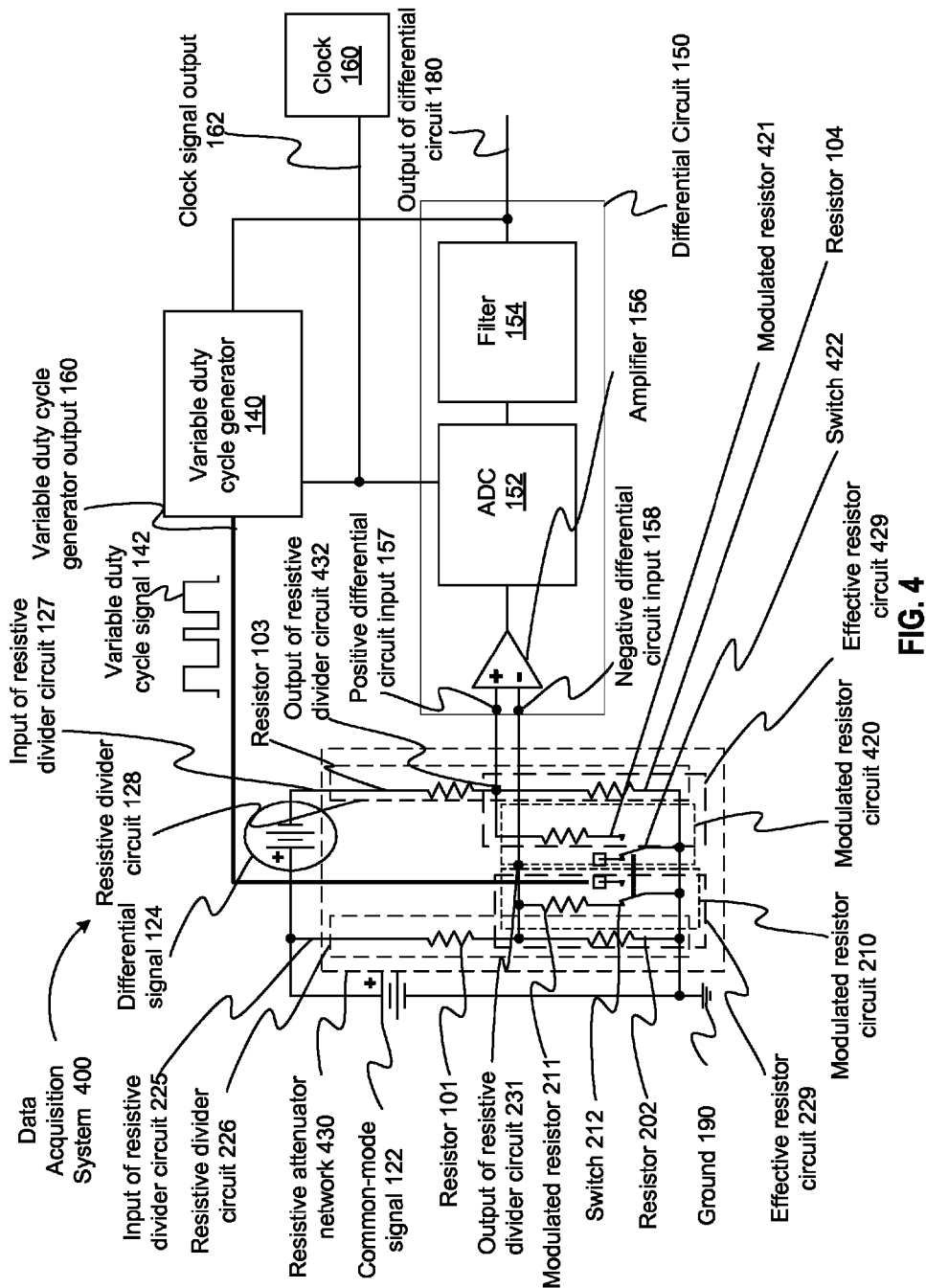
FIG. 4 is a block diagram illustrating a data acquisition system having a resistive attenuator network in accordance with another embodiment.

In the embodiment illustrated in FIG. 3, by opening and closing switch 312, the modulated resistor 311 switches between shorted and connected. Switch 312 toggles from a higher attenuation (i.e., switch 312 open) to a lower attenuation (i.e., switch 312 closed). As a result the effective attenuation seen at the output of resistive divider circuit 331 changes with the toggling of switch 312. Likewise, the attenuation of common mode signal 122 changes in relation to the effective attenuation and can be adjusted by modulating the modulated resistor circuit 310. The configuration of the modulated resistor circuit 310 reduces the effect of the parasitic capacitance when the switch is off. A simple n-channel MOS transmission gate or similar architecture may be used FIG. 4 is a block diagram illustrating a data acquisition system having a resistive attenuator network in accordance with another embodiment. FIG. 4 shows resistive attenuation network 430 wherein modulated resistor circuits 210 and 420 are coupled to resistive divider circuit 226 and 128, respectively.

The data acquisition system 400 in FIG. 4 may perform the same or similar actions, functions, operations, and methods as well as be configured in the same or similar manner as the data acquisition system 200 of FIG. 2. Additionally, the data acquisition system 400 may include the additional or alternative features as follows.

In one embodiment, both branches of the resistive attenuator network 430 are modulated. Data acquisition system 400 includes a modulated resistor circuit 210 is operatively coupled to the first resistive divider circuit 226 and modulated resistor circuit 420 and is operatively coupled to the second resistive divider circuit 128. Modulated resistor circuit 210 comprises modulated resistor 211 and switch 212. Modulated resistor circuit 210 is coupled in parallel with resistor 202. Modulated resistor circuit 420 comprises modulated resistor 421 and switch 422, and is coupled in parallel with resistor 104. Switch 212 connects the modulated resistor 211 to ground 190. Switch 422 connects the modulated resistor 421 to ground 190.

In one embodiment, when two modulated resistor circuits 210 and 420 are operatively coupled to resistive attenuator network 430, the two switches, 212 and 422, are fed with waveforms from the variable duty cycle generator 140 with different duty cycles. The different waveforms respectively increase and decrease from some initial value. In one embodiment, the waveforms are the variable duty cycle signal 142 and the complementary waveform of the variable duty cycle signal 142. Modulated resistor circuit 210 and 420 are applied to both the attenuating branches of the resistive attenuator network 430 (i.e., resistive divider circuit 226 and 128, respectively) to most closely match and balance any undesirable parasitic interaction between the modulated resistor circuits 210 and 420 and the attenuating branches (i.e., resistive divider circuit 226 and 128). The specific action of the periodic switching of the modulated resistor 421 onto the resistive output impedance of the attenuating branch (i.e., resistive divider circuit 128) is to modulate the gain of that leg of the resistive attenuator network 430 with the switching function of the variable duty cycle signal 142. As the duty cycles of the two waveforms diverge, the average gain mismatch created by these switching sequences changes, and at some combination, exactly compensates for the initial residual mismatch in the resistive attenuator network 430, and perhaps in the subsequent differential states in differential circuit 150. As a result, the sensitivity to common mode signal 122 is cancelled out.

In one embodiment, switches 212 and 422 may receive variable duty cycle signal 142 and the complementary waveform of variable duty cycle signal 142, respectively. In such a configuration, a single variable duty cycle generator 140 may be used. In another embodiment, multiple variable duty cycle generators 140 and variable duty cycle signals 142 may be used. Switch 422 modulates the modulated resistor circuit 420, so that modulated resistor 421 toggles between an open circuit and ground 190. As a result, the apparent resistance of the modulated resistor circuit 420 is the modulated resistor value divided by Ton/Tperiod (i.e., assuming that the on switch resistance is negligible). For example, if the modulated resistor 421 is switched in for 10% of the total duration, the modulated resistor 421 apparent value is ten times the modulated resistor 421 physical value. Likewise, the equivalent resistance of the effective resistor circuit 229 can be modulated. As a result the effective attenuation of the effective resistor circuit 229 can be changed based on variable duty cycle signal 142. For example, if resistor 104 is 100 Ohms, the modulated resistor 421 is 10 Ohms, and the switch 422 is on 10% of the time (10% duty cycle), the apparent resistance of modulated resistor 421 is 100 Ohms and the equivalent resistance of effective resistor circuit 429 is 50 Ohms. If resistor 103 is 50 Ohms and common mode signal is 10V, the effective attenuation is 50% or 5V. Accordingly, the attenuation of common mode signal 122 changes in relation to the effective attenuation of the effective resistor circuit 229 and effective resistor circuit 429 and can be adjusted by modulating the modulated resistor circuit 210 and the modulated resistor circuit 420. It should be noted that the component values are provided only as an example and that the components may have other values in alternative embodiments.

In one embodiment, as the modulated resistor circuits 210 and 420 are adjusted the gain factors of each arm of the resistive attenuator network 430 are being slightly modulated by the switching waveforms. This modulation causes sidebands to appear on the input signal. In one embodiment, the choice of a delta-sigma modulator to create the switching sequences ensures that the modulation components are strongly concentrated around the mean clock frequency of clock 160. This means that the frequency components can be effectively removed by a low pass filter. In one embodiment, filter 154 may implemented as a low pass filter. In another embodiment, filter 154 may be inherently part of the ADC 152, for example.

It should be noted that charge injection, if significant, may be managed by implementing a modulated resistor circuit 210 and 420 on each branch (i.e., resistive divider circuit 226 and 127, respectively) of resistive attenuator network 430. To the first order, the charge injection artifacts into each branch will be approximately the same, and will be rejected by the differential circuit 150.

Figure 5:
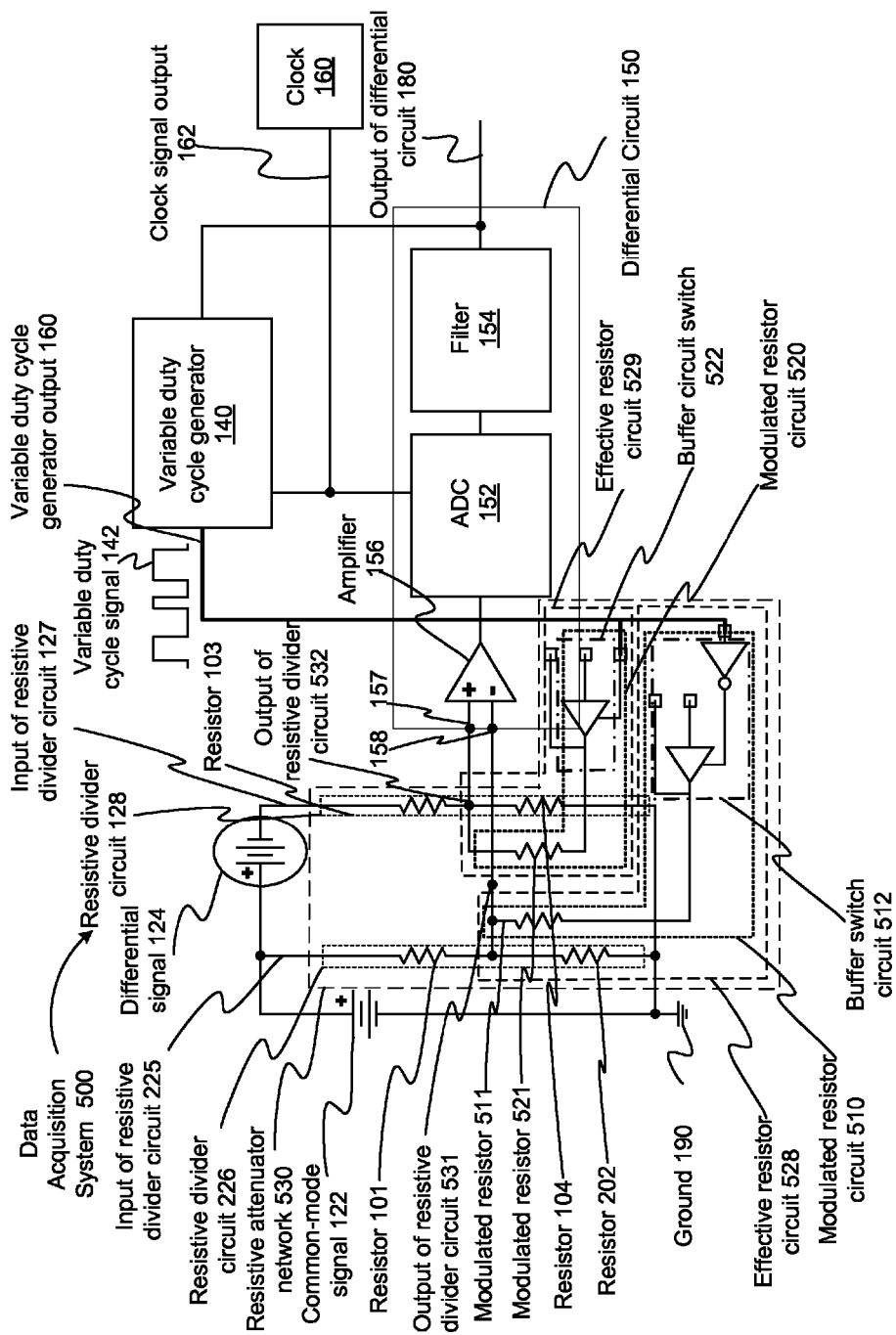
FIG. 5 is a block diagram illustrating a data acquisition system having a resistive attenuator network in accordance with another embodiment.

FIG. 5 is a block diagram illustrating a data acquisition system having a resistive attenuator network 530 in accordance with another embodiment. The embodiment illustrated in FIG. 5 shows a resistive attenuation network 530 wherein modulated resistor circuit 510 and 520 are coupled to resistive divider circuit 226 and 128, respectively. The switches are implemented with buffer switch circuits 512 and 522. The data acquisition system 500 in FIG. 5 may perform the same or similar actions, functions, operations, and methods as well as be configured in the same or similar manner as the data acquisition system 400 of FIG. 4. Additionally, the data acquisition system 500 may include the additional or alternative features as follows.

In one embodiment, both branches of the resistive attenuator network 530 are modulated. Data acquisition system 500 includes a modulated resistor circuit 510 and 520 that are operatively coupled to the first resistive divider circuit 226 and the second resistive divider circuit 128, respectively. Modulated resistor circuit 510 comprises modulated resistor 511 and buffer switch circuit 512, and is coupled in parallel with resistor 202. Modulated resistor circuit 520 comprises modulated resistor 521 and buffer circuit switch 522, and is coupled in parallel with resistor 104. Buffer switch circuit 512 connects the modulated resistor 511 to a virtual ground 190. Buffer circuit switch 522 connects the modulated resistor 521 to virtual ground 190.

In one embodiment, buffer switch circuits 512 and 522 are logic buffer circuits, CMOS logic buffer circuits for example. In order to simulate a switch to ground 190, the buffer switch circuit 512 and 522 must be enabled and set to assert a logical zero. When set to assert a logical zero, buffer switch circuit 512 and 522 looks like a low resistance switch to ground 190. In order to simulate an open switch, the buffer switch circuit output is tristated. Buffer switch circuit 512 and 522 may be implemented using the general purpose input-output (GPIO) cell of an integrated circuit device.

In one embodiment, only resistive divider circuit 226 is operatively coupled with a modulated resistor circuit 510.

In one embodiment, duty cycle modulation of a resistive attenuator network 530 can balance out the imbalances of the resistive attenuator network over a range of frequencies, possibly including DC. A second set of modulated resistor circuits (not shown) designed to have no effect al low frequencies can be added to the resistive attenuator network 530. The second set of modulated resistor circuits (not shown) are switched by another set of waveforms that are at the same frequency and arrival phase as variable duty cycle signal 142. The second set of modulated resistor circuits (not shown) trim the high frequency response of resistive attenuator network 530. Using a second set of modulated resistor circuits (not shown) enables the independent adjustment of imbalances in the resistive attenuator network 530 and increased CMRR at high frequencies.

Figure 6:
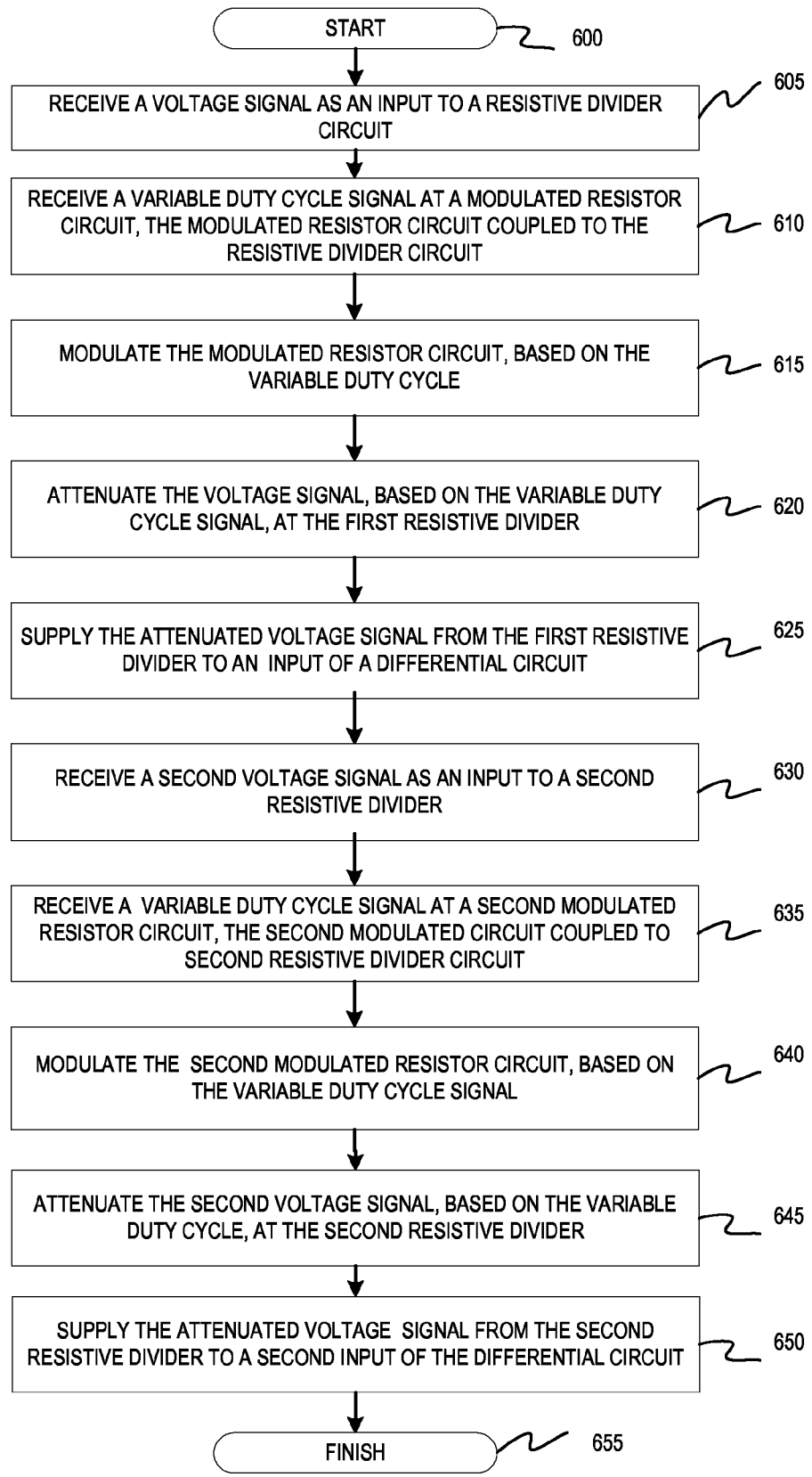
FIG. 6 is a flow diagram illustrating a method of attenuating a signal, according to one embodiment.
Figure 7:
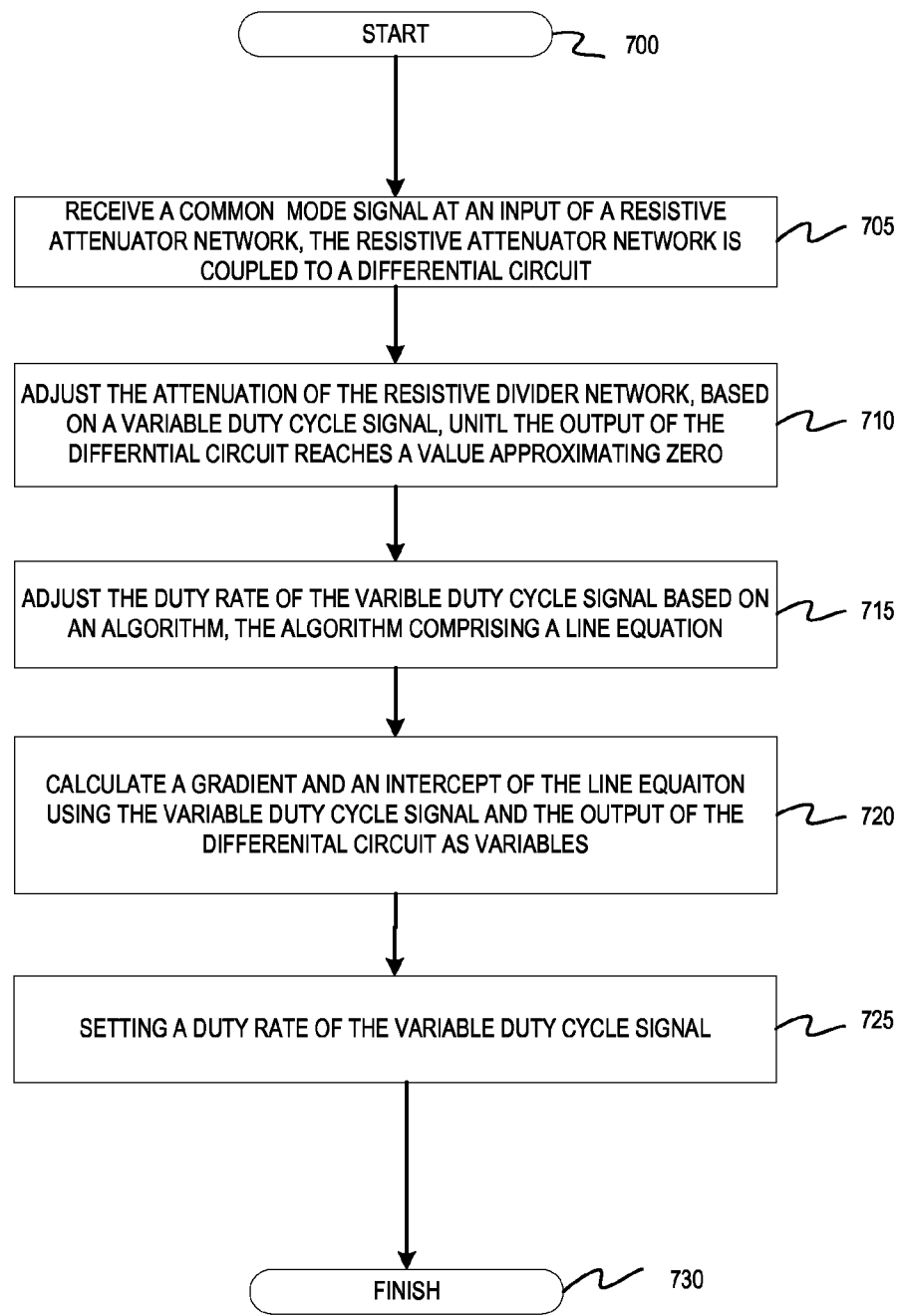
FIG. 7 is a flow diagram illustrating a method of calibration, according to another embodiment.

FIGS. 6 through 7 are flow diagrams illustrating methods for attenuating a signal. For simplicity of explanation, the methods are depicted and described as a series of acts. Although the operations of the methods herein are shown and described in a particular order, such order does not mean that such operations are necessarily performed in that order. Operations in accordance with this disclosure can occur in various orders and/or concurrently, and with other acts not presented and described herein. Certain operations may be performed, at least in part, concurrently with other operations and certain operations may be performed in an inverse order to that shown or described.

FIG. 6 is a flow diagram illustrating a method of attenuating a signal, according to one embodiment. Method 600 begins at block 605 where the method 600 receives a voltage signal (e.g., common mode signal 122) at an input of a resistive divider circuit 225. The resistive divider circuit 226 comprises the resistor 101 and the resistor 202. At block 610, method 600 receives a variable duty cycle signal 142 at a modulated resistor circuit 210. The modulated resistor circuit 210 is operatively coupled to the resistive divider circuit 226. In this example, the modulated resistor circuit 210 is in parallel with the resistor 202. At block 615, method 600 modulates the modulated resistor circuit 210 based on the variable duty cycle signal 142 wherein the modulated resistor 211 is configured to form an effective resistor circuit 229 providing an effective attenuation. In one embodiment, the modulated resistor circuit 210 comprises a modulated resistor 211 coupled to a switch 212. Modulating the modulated resistor circuit 211 by a variable duty cycle signal 142 will change the apparent resistance of the modulated circuit 210. For example, if the switch 212 connects the modulated resistor 211 to ground 190, the modulated resistor 211 will have an apparent value which is the modulated resistor's 211 physical resistance value divided by the time on over the period (Ton/Tperiod) (assuming the on-resistance of switch 212 is negligible). It should be noted that different configurations of the modulated resistor 211 and switch 212 will change the calculation of apparent value. At block 620, method 600 attenuates the voltage signal wherein the effective resistor circuit 229 controls the attenuation of the voltage signal. In one embodiment, the modulated resistor circuit 210 and resistor 202 form an effective resistor circuit 229. The effective resistor circuit 229 has an effective attenuation. The modulated resistor circuit 210 is operatively coupled to the resistive divider circuit 226 so that modulating the modulated resistor circuit 210 changes and effective value of the effective resistor circuit 229. Consequently, the attenuation of the voltage signal is controlled by the effective resistor circuit 229. At block 625, method 600 supplies the attenuated signal (i.e., attenuated voltage signal) to an input of differential circuit 150. In one embodiment, the resistive divider circuit 226 and modulated resistor circuit 210 form one branch of the restive attenuator network 430. The one branch of the resistive attenuator network 430 is coupled to the negative differential circuit input 158.

At block 630, method 600 receives a second voltage signal as an input to resistive divider circuit 127. The second resistive divider circuit 128 comprises a resistor 103 and a resistor 104. In one embodiment, the second voltage signal may be a common mode signal 122. In one embodiment, the second voltage signal may be the same as the voltage signal in block 605. In one embodiment, the second voltage signal may be composed of a common mode signal 122 and a differential signal 124. In one embodiment, the second voltage signal may be different from the first voltage signal in block 605. At block 635, method 600 receives a variable duty cycle signal 142 at a second modulated resistor circuit 420. The second modulated resistor circuit 420 is operatively coupled to the second resistive divider circuit 128. At block 640, method 600 modulates the second modulated resistor circuit 420 based on the variable duty cycle signal 142. The second modulated resistor circuit 420 and the resistor 104 are configured to form a second effective resistor circuit 429 providing a second effective attenuation. In one embodiment, the second modulated resistor circuit 420 comprises a modulated resistor 421 coupled with a switch 422. Modulating the switch 422 creates an apparent resistance value of the modulated resistor 421. In one embodiment, the second variable duty cycle signal is a complementary waveform of the first variable duty cycle signal 142. In such a configuration, one variable duty cycle generator 140 may be used to generate both waveforms. In one embodiment, multiple variable duty cycle generators 140 are used. In block 645, the method 600 attenuates the second voltage signal wherein the effective resistor circuit 429 controls the attenuation of the second voltage signal. In one embodiment, the second resistive divider circuit 128 is operatively coupled to the modulated resistor circuit 420. The modulated resistor circuit 420 and resistor 104 form an effective resistor circuit 429 that has an effective attenuation. The effective resistor circuit 429 controls the attenuation of the second signal. A variable duty cycle signal 142 modulates the modulated resistor circuit 420 changing the effective attenuation. Consequently, the attenuation of the second voltage signal is adjusted by the second variable duty cycle signal 142. In block 650, method 600 supplies the attenuated second voltage signal to the positive differential circuit input 157. In one embodiment, differential circuit 150 receives the attenuated voltage signals from both branches simultaneously. In one embodiment, only one resistive divider circuit 226 of the resistive attenuation network 430 is coupled with a modulated resistor circuit 210. In one embodiment, both resistive divider circuits 226 and 128 are coupled with modulated resistor circuits 210 and 420, respectively.

FIG. 7 is a flow diagram illustrating a method of calibration, according to another embodiment. In one embodiment, method 700 may be used to calibrate a data acquisition system 400. Method 700 begins at block 705 where the method 700 receives a common mode signal 122 at the input of the resistive attenuator network 430 (e.g., input of resistive divider 225 and 127). The resistive attenuator network 430 is coupled to the inputs of a differential circuit 150 (e.g., positive and negative differential circuit inputs 157 and 158). At block 710, method 700 adjusts the attenuation of the resistive attenuator network 430, based on a variable duty cycle signal, until the output of the differential circuit reaches a value approximating zero. In one embodiment, the modulated resistor circuit 210 is operatively coupled to a resistive divider circuit 226. It should be noted that either one or both of the resistive divider circuits 226 and 128 may be configured with a modulated resistor circuit 210 and 420, respectively. Modulating the modulated resistor circuit 210 based on the variable duty cycle signal 142 changes the effective attenuation of the effective resistor circuit 229. Consequently by modulating the modulated resistor circuits 210 and 420, the attenuation of the common mode signal 122 is adjusted. The variable duty cycle signal 142 is adjusted until the output of the differential circuit 150 reaches a value approximating zero.

It should be noted that either one or both of the resistive divider circuits 226 and 128 may be configured with a modulated resistor circuit 210 and 420, respectively. As such, variable duty cycle signal 142 can modulate both modulated resistor circuit 210 and 420 and change the effective attenuation of both effective resistor circuits 229 and 429. In one embodiment, one modulated resistor circuit 420 may receive the complementary waveform of the variable duty cycle signal 142 received at modulated resistor circuit 210.

At block 715, method 700 adjusts the duty rate of the variable duty cycle signal based on an algorithm, the algorithm comprising a line equation. At block 720, method 700 calculates a gradient and an intercept of the line equation using the variable duty cycle signal 142 and the output of the differential circuit 150 as variables. In one embodiment, the algorithm comprises sending two different duty cycles of the variable duty cycle signal 142 and receiving two outputs of the differential circuit 150 that correspond to the different duty cycles of the variable duty cycle signal 142. Consequently, four related values are obtained using the variable duty cycle signal 142 and the output of the differential circuit 150 as variables. With the four values the gradient and intercept of the line equation can be derived. The data acquisition system 400 uses the line equation to determine how to adjust the duty cycle so that the output of the differential circuit 150 approximates a zero value.

At block 725, method 700 sets the duty rate of the variable duty cycle signal 142. Once the duty rate of the variable duty cycle signal 142 has been found that to produce an output of the differential circuit 150 to approximate zero, the duty rate is set. In one embodiment, setting the duty rate occurs once and the duty rate is not adjusted again. In one embodiment, the duty rate can be set multiple times either by manual calibration or dynamically. In another embodiment, the duty rate can be re-calibrate and set when conditions change such as temperature and voltage, among others.

It should be noted that calibration may occur on the production line or dynamically on a test signal. The calibration can me made once or many times. Moreover, calibration can be made dependent on temperature, supply voltage, or any other system variable.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "modulating," "storing," "providing," "attenuating," "generating," "switching," "authenticating," "producing," "supplying," "setting," "maintaining," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the above description. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth above are merely exemplary. Particular implementations may vary from these exemplary details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled

What is claimed is:

1. An apparatus comprising:
  a resistive divider circuit, comprising a first resistor and a second resistor;
  a modulated resistor circuit, operatively coupled to the resistive divider circuit, wherein the second resistor and the modulated resistor circuit form an effective resistor circuit providing an effective attenuation; and
  a variable duty cycle generator, to generate a variable duty cycle signal, wherein the variable duty cycle signal modulates the modulated resistor circuit to control the effective attenuation until an output of a differential circuit is within a predetermined range.

2. The apparatus of claim 1, wherein the variable duty cycle generator is a delta-sigma modulator circuit.

3. The apparatus of claim 1, further comprising:
  a differential circuit, wherein the resistive divider circuit is operatively coupled to an input of the differential circuit.

4. The apparatus of claim 3, wherein the differential circuit comprises a delta-sigma converter circuit.

5. The apparatus of claim 3, further comprising:
  an input of the resistive divider circuit, wherein a voltage received at the input is attenuated to an operational voltage of the differential circuit.

6. The apparatus of claim 3, further comprising:
  a second resistive divider circuit, comprising a third resistor and a fourth resistor;
  a second modulated resistor circuit, operatively coupled to the resistive divider circuit, wherein the fourth resistor and the second modulated resistor circuit form a second effective resistor circuit providing a second effective attenuation; and a second variable duty cycle signal, generated by the variable duty cycle generator, wherein the second variable duty cycle signal modulates the second modulated resistor circuit to control the second effective attenuation.

7. The apparatus of claim 6, wherein the second variable duty cycle signal is a complementary waveform of the variable duty cycle signal.

8. The apparatus of claim 1, wherein the modulated resistor circuit comprises:

a modulated resistor; and a switch, coupled to the modulated resistor, the switch configured to receive the variable duty cycle signal from the variable duty cycle generator and modulate the modulated resistor.

9. The apparatus of claim 8, wherein the switch is configured to switch between a higher attenuation and a lower attenuation.

10. The apparatus of claim 8, wherein the switch is configured to open and to close the modulated resistor circuit.

11. The apparatus of claim 8, wherein the switch comprises one or more field-effect transistors.

12. The apparatus of claim 8, wherein the switch comprises a buffer switch circuit, configured to receive the variable duty cycle signal from the variable duty cycle generator.

13. A method comprising:

receiving a first signal as an input to a resistive divider circuit, the resistive divider circuit comprising a first resistor and second resistor;

receiving a variable duty cycle signal at a modulated resistor circuit, wherein the modulated resistor circuit is operatively coupled to the resistive divider circuit;

modulating the modulated resistor circuit, based on the variable duty cycle signal, wherein the modulated resistor circuit and the second resistor are configured to form an effective resistor circuit providing an effective attenuation; and attenuating the first signal, wherein the effective resistor circuit controls the attenuation of the first signal.

14. The method of claim 13, wherein the variable duty cycle signal is received from a delta-sigma modulator circuit.

15. The method of claim 13, further comprising:

supplying the attenuated first signal to an input of a differential circuit.

16. The method of claim 15, wherein the differential circuit comprises a delta-sigma converter circuit.

17. The method of claim 15, further comprising:

receiving a second signal as an input to a second resistive divider circuit, the second resistive divider circuit comprising a third resistor and fourth resistor;

receiving a second variable duty cycle signal at a second modulated resistor circuit, wherein the second modulated resistor circuit is operatively coupled to the second resistive divider circuit;

modulating the second modulated resistor circuit, based on the second variable duty cycle signal, wherein the second modulated resistor circuit and the fourth resistor are configured to form a second effective resistor circuit providing a second effective attenuation;

attenuating the second signal, wherein the second effective resistor circuit controls the attenuation of the second signal; and supplying the attenuated second signal to a second input of the differential circuit.

18. A method comprising:

receiving a common mode signal at an input of a resistive attenuator network, wherein the resistive attenuator network is operatively coupled to the inputs of a differential circuit; and adjusting an attenuation of the resistive attenuator network, based on varying a duty cycle of a signal, until an output of the differential circuit reaches a value approximating zero.

19. The method of claim 18, further comprising:
varying the duty cycle signal using a line equation.

20. The method of claim 19, further comprising:
calculating a gradient and an intercept of the line equation using the duty cycle of the signal and the output of the differential circuit as variables.

21. The method of claim 18, further comprising:
setting the duty cycle of the signal.

* * * * *